United States Patent
Liu

(10) Patent No.: US 10,719,390 B2
(45) Date of Patent: Jul. 21, 2020

(54) MEMORY SYSTEM, CONTROLLER, MEMORY AND READING METHOD THEREOF

(71) Applicant: MACRONIX INTERNATIONAL CO., LTD., Hsinchu (TW)

(72) Inventor: Yi-Chun Liu, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/208,601

(22) Filed: Dec. 4, 2018

(65) Prior Publication Data

US 2020/0174880 A1 Jun. 4, 2020

(51) Int. Cl.
- *G11C 29/00* (2006.01)
- *G06F 11/10* (2006.01)
- *G11C 29/52* (2006.01)

(52) U.S. Cl.
CPC ...... *G06F 11/1004* (2013.01); *G06F 11/1068* (2013.01); *G11C 29/52* (2013.01)

(58) Field of Classification Search
CPC ... G06F 11/1004; G06F 11/1068; G11C 29/52
See application file for complete search history.

(56) References Cited

U.S. PATENT DOCUMENTS

2018/0205396 A1* 7/2018 Ikegawa ............. G06F 11/1048

* cited by examiner

*Primary Examiner* — Samir W Rizk
(74) *Attorney, Agent, or Firm* — McClure, Qualey & Rodack, LLP

(57) ABSTRACT

A memory system, a controller, a memory and a reading method thereof are provided. The reading method includes the following steps. A plurality of duplicated contents which are formed by duplicating one data content several times are received by a voting circuit. A voting procedure is performed by the voting circuit to obtain a voted content which is a majority of the duplicated contents.

19 Claims, 5 Drawing Sheets

MEMORY SYSTEM, CONTROLLER, MEMORY AND READING METHOD THEREOF

TECHNICAL FIELD

The disclosure relates in general to a storage technology, and more particularly to a memory system, a controller, a memory and a reading method thereof.

BACKGROUND

Along with the development of storage technology, various memories are invented. In a memory system, an error-correcting code (ECC) circuit is used to detect and correct the most common kinds of internal data corruption. However, the ECC circuit consumes lots of energy.

SUMMARY

The disclosure is directed to a memory system, a controller, a memory and a reading method thereof. A voting procedure is used in the reading method, and an ECC procedure is performed only if a CRC verifying procedure fails. Therefore, the energy can be greatly saved.

According to one embodiment, a memory system is provided. The memory system includes a memory to store data and a controller. The memory is used to store data. The controller is used to perform a read operation on the memory. The controller has more than one data verifying circuits to verify the data stored in the memory during the read operation.

According to alternative embodiment, a reading method of a memory is provided. The reading method includes the following steps. A plurality of duplicated contents which are formed by duplicating one data content several times are received by a voting circuit. A voting procedure is performed by the voting circuit to obtain a voted content which is a majority of the duplicated contents.

According to another embodiment, a controller is provided. The controller includes a memory interface circuit connected to a memory. The memory interface includes a duplicator and a voting circuit. The duplicator is used for duplicating one data content several times to obtain a plurality of duplicated contents. The voting circuit is used for performing a voting procedure to obtain a voted content which is a majority of the duplicated contents.

According to an alternative embodiment, a memory is provided. The memory stores a plurality of duplicated contents which are formed by duplicating one data content several times. A voting procedure is performed to obtain a voted content which is a majority of the duplicated contents.

Figure 1:
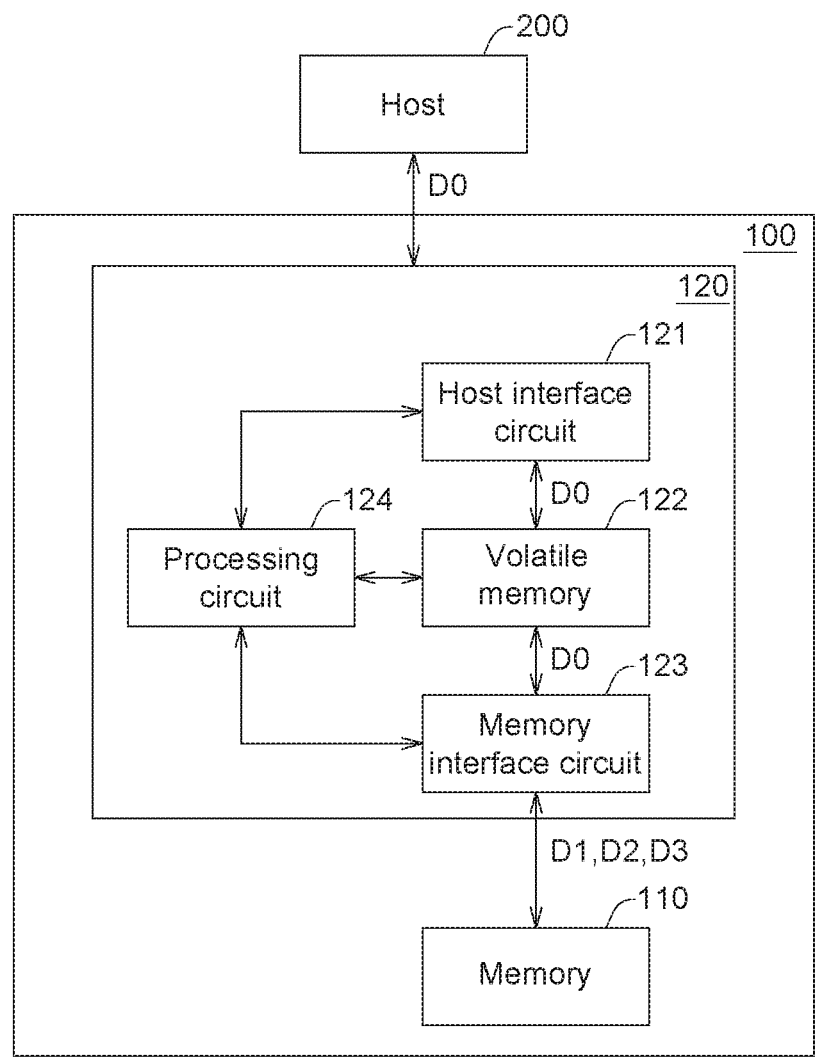
FIG. 1 shows a memory system according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a memory system 100 according to one embodiment. The memory system 100 includes a memory 110 and a controller 120. The memory 110 may be a non-volatile memory, such as a PCM or a NAND Flash. The controller 120 is used for reading and writing the memory 110. The controller 120 includes a host interface circuit 121, a volatile memory 122, a memory interface circuit 123 and a processing circuit 124. The host interface circuit 121 is used for communicating with a host 200. The volatile memory 122 is used for temporarily storing data. For example, the volatile memory 122 may be a SRAM or DRAM. The memory interface circuit 123 is used for communicating with the memory 110. The processing circuit 124 is used for controlling the operation of the host interface circuit 121, the volatile memory 122 and the memory interface circuit 123.

Figure 2:
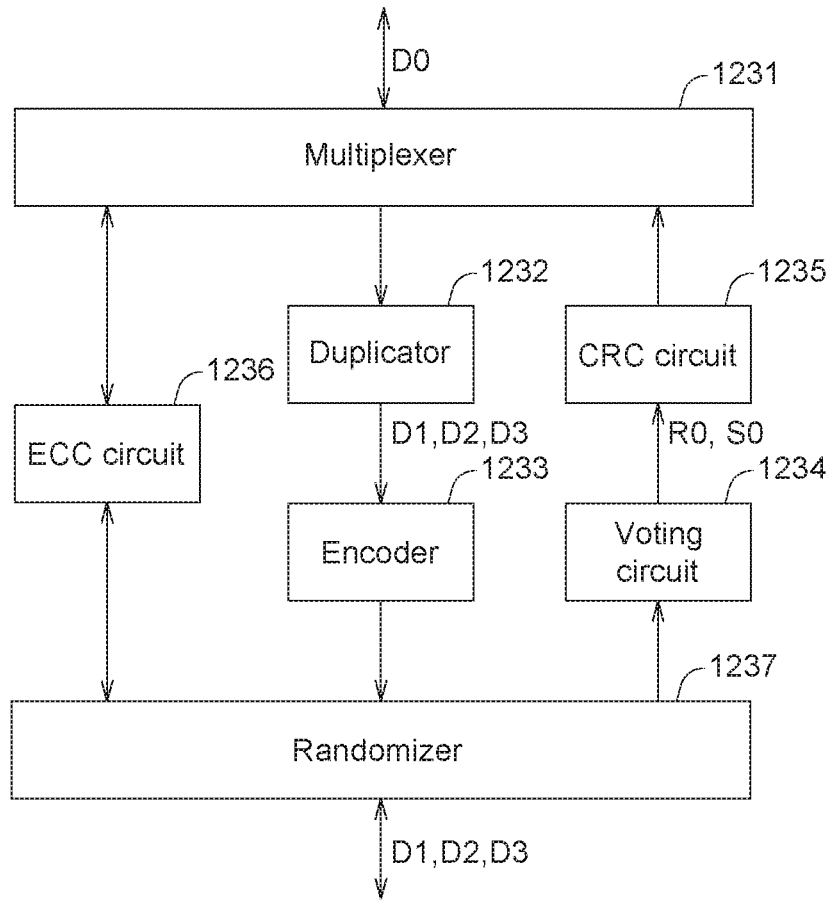
FIG. 2 shows a memory interface circuit according to one embodiment.

Please refer to FIG. 2, which shows the memory interface circuit 123 according to one embodiment. The memory interface circuit 123 includes a multiplexer 1231, a duplicator 1232, an encoder 1233, a voting circuit 1234, a cyclic redundancy check (CRC) circuit 1235, an error-correcting code (ECC) circuit 1236 and a randomizer 1237. The multiplexer 1231 is a device that selects one of several analog or digital input signals and forwards the selected input into a single line. The duplicator 1232 is used for duplicating data. The encoder 1233 is used for encoding a CRC code and an ECC code. The voting circuit 1234 is used for performing a voting procedure (illustrated latter). The CRC circuit 1235 is used for performing a CRC verifying procedure. The ECC circuit 1236 is used for performing an ECC correction procedure. The operation of those elements described above is illustrated via a flowchart as follows. According to the present embodiment, the ECC circuit 1236 is not turned on every time, such that the energy can be saved.

Figure 3:
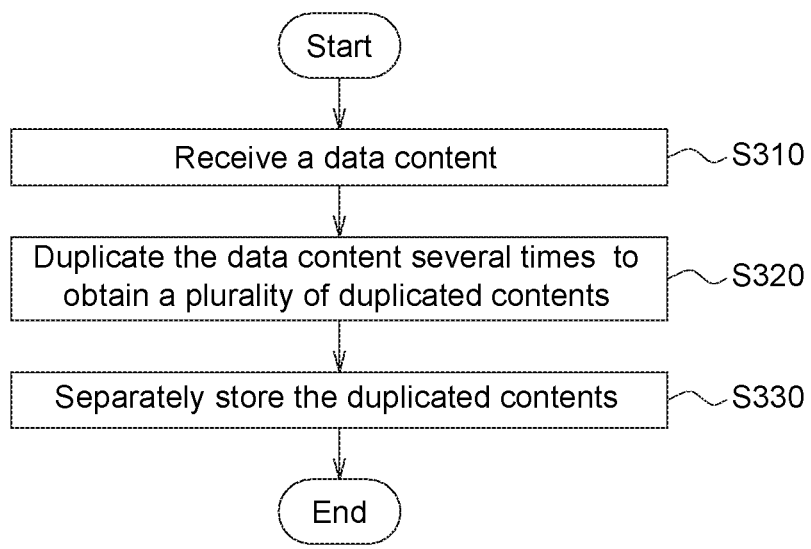
FIG. 3 shows a flowchart of a writing method of a memory according to one embodiment.

Please refer to FIG. 3, which shows a flowchart of a writing method of the memory 110 according to one embodiment. In step S310, a data content D0 is received from the host interface circuit 121. The data content D0 may be 1 bit data or 1 byte data.

Then, in step S320, the duplicator 1232 duplicates the data content D0 several times, such as 3 times, to obtain several duplicated contents D1, D2, D3. The number of the duplicated contents is more than 3. In one embodiment, the data content D0 may be duplicated 5 or more times.

Next, in step S330, the duplicated contents D1, D2, D3 are separately stored in different blocks or different chips of the memory 110. In one embodiment, the number of the chip may be one, and the duplicated contents may be stored in one page for saving the writing time. In one embodiment, the number of the chip may be more than one, and the duplicated contents may be stored in different pages for increasing the reliability.

According to the embodiments described above, the controller 120 has more than one data verifying circuits to verify the data stored in the memory 110 during the read operation. For example, one of the data verifying circuits is the voting circuit 1234 for performing the voting procedure to obtain the voted content R0 which is a majority of the duplicated contents D1, D2, D3. One of the data verifying circuits is the cyclic redundancy check (CRC) circuit 1235 for checking whether the voted content R0 is correct via the CRC verifying procedure. One of the data verifying circuits is the error-correcting code (ECC) circuit 1236 for correcting the voted content R0 via the ECC correction procedure, only if the voted content R0 is incorrect.

Figure 4:
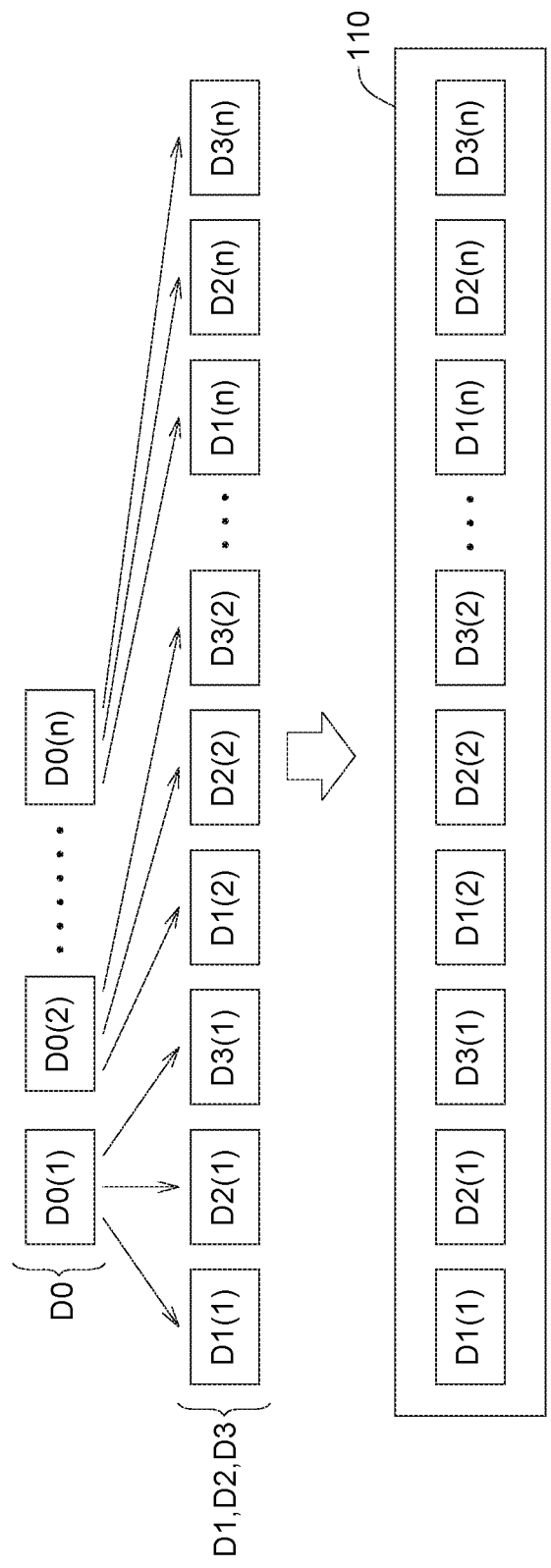
FIG. 4 illustrates a data placement of the memory according to one embodiment.

Please referring to FIG. 4, a data placement of the memory 110 is illustrated according to one embodiment. In the example of FIG. 4, the data content D0 includes data D0(1), D0(2), . . . , D0(n). The data D0(1) is duplicated 3 times to obtain data D1(1), data D2(1) and data D3(1). The data D0(2) is duplicated 3 times to obtain data D1(2), data D2(2) and data D3(2). The data D0(n) is duplicated 3 times to obtain data D1 (n), data D2(n) and data D3(n). In the memory 110, the duplicated contents D1, D2, D3 are arranged in a staggered manner. For example, the data D1(1), the data D2(1), the data D3(1), the data D1(2), the data D2(2), the data D3(2), . . . , the data D1(n), the data D2(n) and the data D3(n) are arranged sequentially.

Figure 5:
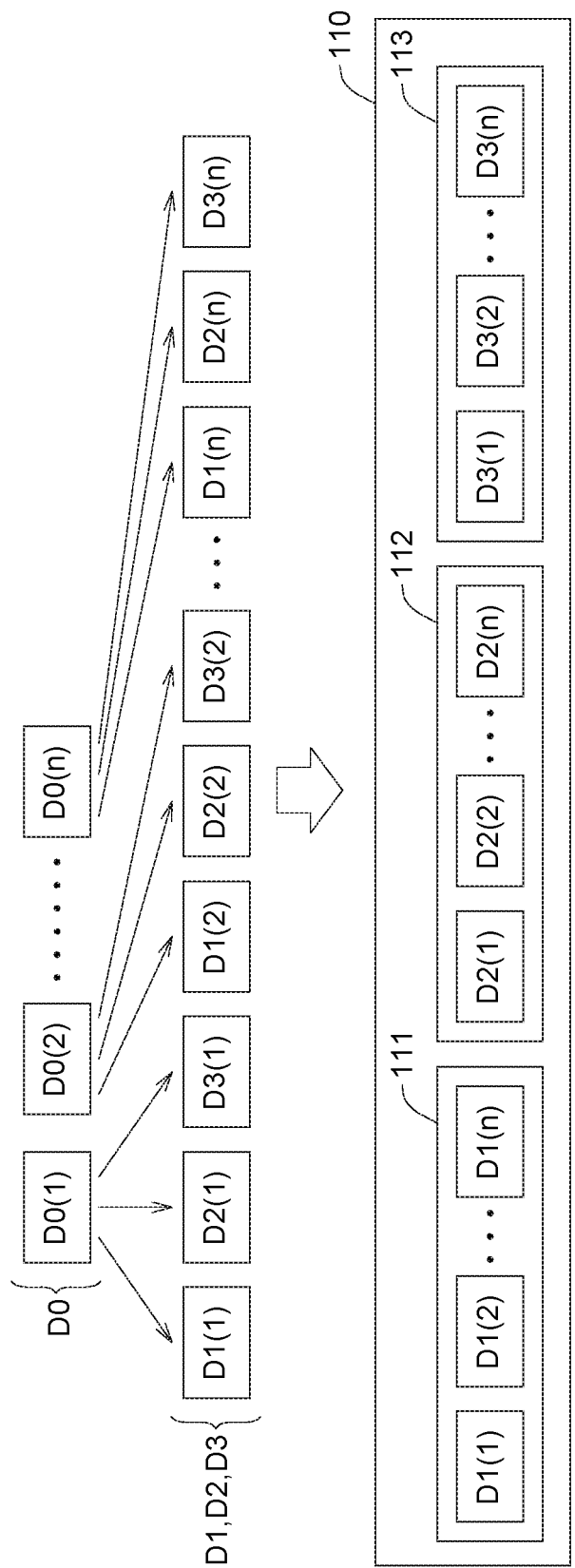
FIG. 5 illustrates another data placement of the memory according to another embodiment.

Please referring to FIG. 5, another data placement of the memory 110 is illustrated according to another embodiment. In the example of FIG. 5, the duplicated contents D1, D2, D3 are stored in different chunks 111, 112, 113. For example, the data D1(1), the data D1(2), . . . , and the data D1(n) are arranged sequentially in the chunk 111. The data D2(1), the data D2(2), . . . , and the data D2(n) are arranged sequentially in the chunk 112. The data D3(1), the data D3(2), . . . , and the data D3(n) are arranged sequentially in the chunk 113.

If the cells in the memory 110 are well, the duplicated contents D1, D2, D3 should be identical. On the other hand, if the duplicated contents D1, D2, D3 are identical, there is a great probability that the cells in the memory 110 are well and each of the duplicated contents D1, D2, D3 is corrected. Further, even if some of the cells are corrupt, there is still a big probability that the majority of the duplicated contents D1, 02, D3 is correct.

Figure 6:
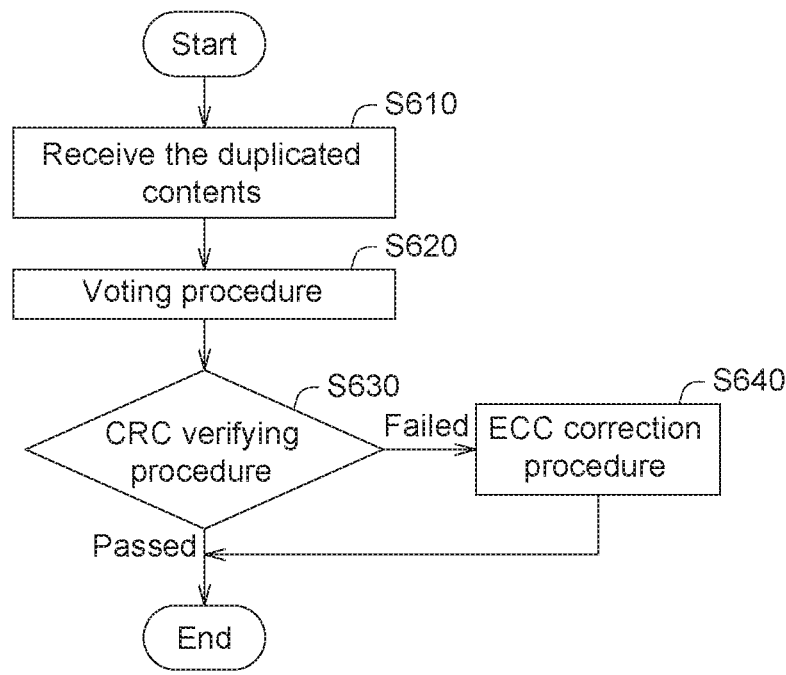
FIG. 6 shows a flowchart of a reading method of the memory according to one embodiment.

Please refer to FIG. 6, which shows a flowchart of a reading method of the memory 110 according to one embodiment. In step S610, the memory interface circuit 123 receives the several duplicated contents D1, D2, D3 which are formed by duplicating the data content D0 several times.

Next, in step S620, the voting circuit 1234 performs the voting procedure to obtain a voted content R0 which is the majority of the duplicated contents D1, D2, D3. Refer to Table I, which shows an example of the voted content R0 and a probability strength S0 corresponding the voted content R0. In the table I, each of the duplicated contents D1, D2, D3 is one bit data.

The voted content R0 is the majority of the duplicated contents D1, D2, D3, so the accuracy of the voted content R0 depends on the consistency degree of the duplicated contents D1, D2, D3. If the accuracy of the voted content R0 is high, the probability strength S0 is "1." If the accuracy of the voted content R0 is low, the probability strength S0 is "0." For example, if the duplicated contents D1, D2, D3 are "0", "0" and "0", then the voted content R0 is "0" and the probability strength S0 is "1." If the duplicated contents D1, D2, D3 are "0", "0" and "1", then the voted content R0 is "0" and the probability strength S0 is "0."

TABLE I

| D1 | D2 | D3 | R0 | S0 |
|----|----|----|----|----|
| 0 | 0 | 0 | 0 | 1 |
| 0 | 0 | 1 | 0 | 0 |
| 0 | 1 | 0 | 0 | 0 |
| 0 | 1 | 1 | 1 | 0 |
| 1 | 0 | 0 | 0 | 0 |
| 1 | 0 | 1 | 1 | 0 |
| 1 | 1 | 0 | 1 | 0 |
| 1 | 1 | 1 | 1 | 1 |

Refer to Table II, which shows another example of the voted content R0 and the probability strength S0 corresponding the voted content R0. In the table II, each of the duplicated contents D1, D2, D3 is one byte data.

For example, if the duplicated contents D1, D2, D3 are "00010000", "00010000" and "00000000", then the voted content R0 is "00010000" and the probability strength S0 is "0." If the duplicated contents D1, D2, D3 are "00010001", "00010001" and "00010001", then the voted content R0 is "00010001" and the probability strength S0 is "1."

TABLE II

| D1 | D2 | D3 | R0 | S0 |
|----|----|----|----|----|
| 00010000 | 00010000 | 00000000 | 00010000 | 11101111 |
| 00010001 | 00010001 | 00010001 | 00010001 | 11111111 |
| 10001000 | 10000000 | 10001000 | 10001000 | 11110111 |
| 11101011 | 11111111 | 11101011 | 11101011 | 11101011 |
| 10010001 | 10010001 | 10010001 | 10010001 | 11111111 |
| 11001010 | 11001010 | 11001010 | 11001010 | 11111111 |
| 00010001 | 00000001 | 00010001 | 00010001 | 11101111 |
| 00100010 | 11000010 | 00100010 | 00100010 | 00011111 |

The number of the duplicated contents is equal to or more than 3, such as 3, 4, 5 or more, so the majority thereof can be selected to be the voted content R0. According to the Law of large numbers, the majority can be deemed as the correct content. In one embodiment, the size of each of the duplicated contents can be increased to speed up the voting procedure. Or, in another embodiment, the size of each of the duplicated contents can be decreased to increase the accuracy of the voting procedure.

Afterwards, in step S630, the CRC circuit 1235 checks whether the voted content R0 is correct via the CRC verifying procedure. In one embodiment, a calculating CRC code is calculated according to one or more voted contents R0. Then, whether the calculating CRC code and a predetermined CRC code are identical is determined. If the calculating CRC code and the predetermined CRC code are identical, then the voted contents R0 are correct and the process terminated. That is to say, the reading method is correctly performed without the ECC procedure, such that the energy is saved. If the calculating CRC code and the predetermined CRC code are not identical, then the voted contents R0 may be incorrect and the process proceeds to step S640.

In one embodiment, the predetermined CRC code storing in the memory 110 may be duplicated and then a voted predetermined CRC code may be used in the CRC verifying procedure.

In step S640, the ECC circuit 1236 corrects the voted content R0 via the ECC correction procedure. In this embodiment, the error-correcting code stored in the memory 110 is used and the ECC correction procedure is performed only if the voted content R0 is incorrect.

Figure 7:
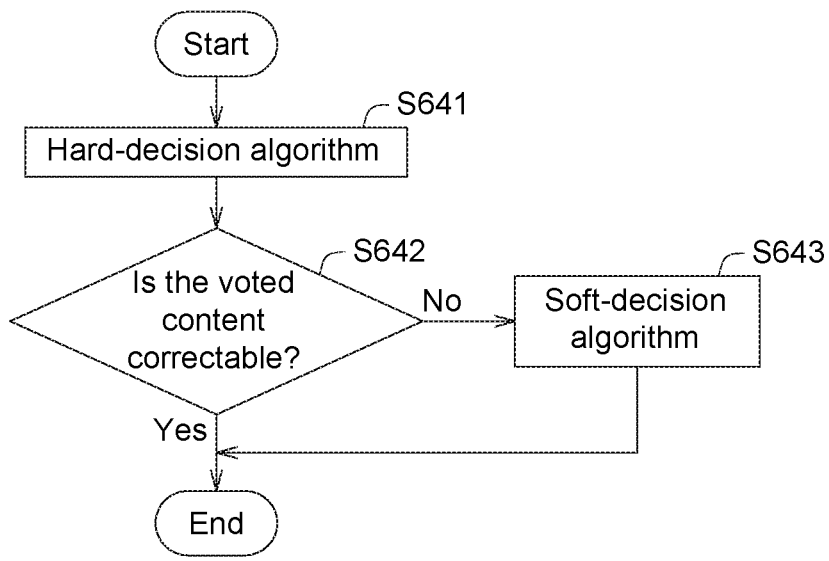
FIG. 7 shows details steps of the step S640 according to one embodiment.

Please refer to FIG. 7, which shows details steps of the step S640 according to one embodiment. In one embodiment, the ECC correction procedure may be performed via a hard-decision algorithm and a soft-decision algorithm. In step S641, the ECC circuit 1236 corrects the voted content R0 via the hard-decision algorithm.

In step S642, whether the voted content R0 is correctable is determined. If the voted content R0 is correctable via the hard-decision algorithm, then the process terminated; if the voted content R0 is not correctable via the hard-decision algorithm, then the process proceeds to step S643.

In step S643, the ECC circuit 1236 corrects the voted content R0 via the soft-decision algorithm. In this step, the probability strength S0 is used for the soft-decision algorithm. Therefore, the ECC circuit 1236 can perform the soft-decision algorithm without any complex calculated probability information.

Based on above, the voting procedure is used in the reading method, and the ECC procedure is performed only if the CRC verifying procedure fails. Therefore, the energy can be greatly saved. Further, the probability strength S0 obtained in the voting procedure can be used in the soft-decision algorithm of the ECC procedure, so the calculating complexity is greatly reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory system, comprising:
a memory used to store data, and
a controller used to perform a read operation on the memory,
wherein the controller has more than one data verifying circuits to verify the data stored in the memory during the read operation;
wherein the controller comprises:
   a duplicator for duplicating one data content several times to obtain a plurality of duplicated contents;
   wherein one of the data verifying circuits is a voting circuit for performing a voting procedure to obtain a voted content which is a majority of the duplicated contents; and
   wherein one of the data verifying circuits is a cyclic redundancy check (CRC) circuit for checking whether the voted content is correct via a CRC verifying procedure.

2. The memory system according to claim 1, wherein one of the data verifying circuits is an error-correcting code (ECC) circuit for correcting the voted content via an ECC correction procedure, only if the voted content is incorrect.

3. A reading method of a memory, comprising:
receiving, by a voting circuit, a plurality of duplicated contents which are formed by duplicating one data content several times;
performing, by the voting circuit, a voting procedure to obtain a voted content which is a majority of the duplicated contents; and
checking, by a cyclic redundancy check (CRC) circuit, whether the voted content is correct via a CRC verifying procedure.

4. The reading method according to claim 3, wherein the duplicating contents are separately stored.

5. The reading method according to claim 3, wherein the number of the duplicated contents is equal to or more than 3.

6. The reading method according to claim 3, wherein the majority is used to be deemed as a correct content according to a Law of large numbers.

7. The reading method according to claim 3, further comprising:
correcting, by an error-correcting code (ECC) circuit, the voted content via an ECC correction procedure, only if the voted content is incorrect.

8. The reading method according to claim 3, wherein in the step of voting, a probability strength corresponding the voted content is obtained, and in the step of correcting the voted content, the probability strength is used.

9. A controller, comprising:
a memory interface circuit connected to a memory, wherein the memory interface circuit includes:
a duplicator for duplicating one data content several times to obtain a plurality of duplicated contents;
a voting circuit for performing a voting procedure to obtain a voted content which is a majority of the duplicated contents; and
a cyclic redundancy check (CRC) circuit for checking whether the voted content is correct via a CRC verifying procedure.

10. The controller according to claim 9, wherein the duplicating contents are separately stored in the memory.

11. The controller according to claim 9, wherein the number of the duplicated contents is equal to or more than 3.

12. The controller according to claim 11, wherein the majority is used to deemed as a correct content according to a Law of large numbers.

13. The controller according to claim 9, wherein the memory interface circuit further comprises:
an error-correcting code (ECC) circuit for correcting the voted content via an ECC correction procedure, only if the voted content is incorrect.

14. The controller according to claim 9, wherein the voting circuit further obtains a probability strength corresponding the voted content, and the ECC circuit uses the probability strength to correct the voted content.

15. A memory, storing a plurality of duplicated contents which are formed by duplicating one data content several times, and storing a cyclic redundancy check (CRC) code which is used for checking whether a voted content is correct, wherein a voting procedure is performed to obtain the voted content which is a majority of the duplicated contents.

16. The memory according to claim 15, wherein the duplicating contents are separately stored.

17. The memory according to claim 15, wherein the number of the duplicated contents is equal to or more than 3.

18. The memory according to claim 15, wherein the majority is used to be deemed as a correct content according to a Law of large numbers.

19. The memory according to claim 15, further storing an error-correcting code (ECC), wherein only if the voted content is incorrect, the ECC is used for correcting the voted content via an ECC correction procedure.

* * * * *